United States Patent [19]

Tsujimoto

[11] Patent Number: 5,363,333
[45] Date of Patent: Nov. 8, 1994

[54] DYNAMIC RANDOM ACCESS MEMORY DEVICE HAVING POWER SUPPLY SYSTEM APPROPRIATELY BIASING SWITCHING TRANSISTORS AND STORAGE CAPACITORS IN BURN-IN TESTING PROCESS

[75] Inventor: Akira Tsujimoto, Tokyo, Japan
[73] Assignee: NEC Corporation, Tokyo, Japan
[21] Appl. No.: 129,375
[22] Filed: Sep. 30, 1993

[30] Foreign Application Priority Data

Sep. 30, 1992 [JP] Japan .................................. 4-262323

[51] Int. Cl.$^5$ .............................................. G11C 13/00
[52] U.S. Cl. ................................ 365/201; 365/189.09; 365/226; 327/530; 327/538
[58] Field of Search ..................... 365/201, 226, 189.09; 307/296.1, 296.6

[56] References Cited

U.S. PATENT DOCUMENTS

| 5,249,155 | 9/1993 | Arimoto | 365/201 X |
| 5,268,871 | 12/1993 | Dhong | 365/226 |
| 5,283,762 | 2/1994 | Fujishima | 365/189.09 |

FOREIGN PATENT DOCUMENTS

| 63-181196 | 7/1988 | Japan | 365/201 |
| 1-100788 | 4/1989 | Japan | 365/201 |
| 1-132156 | 5/1989 | Japan . | |
| 2-3148 | 1/1990 | Japan . | |
| 8200896 | 3/1982 | WIPO | 365/201 |

Primary Examiner—Eugene R. LaRoche
Assistant Examiner—Son Mai
Attorney, Agent, or Firm—Sughrue, Mion, Zinn, Macpeak & Seas

[57] ABSTRACT

A power supply system incorporated in a dynamic random access memory device distributes a step-down power voltage and a boosted voltage to a sense amplifier unit and a word line driver for allowing switching transistors of the memory cells to transfer the step-down voltage level to the storage capacitor without any voltage drop in read-out and write-in modes, and the switching transistors and the storage capacitors are subjected to inspections through a burn-in testing process before delivery from the manufacturing factory so as to actualize potential failure; however, either switching transistors or storage capacitors are insufficiently stressed in the burn-in testing process, and the power supply system changes the ratio of the boosted voltage to the step-down power voltage between the read-out and write-in modes and the burn-in testing process so that the switching transistors and the storage capacitors are sufficiently stressed.

6 Claims, 12 Drawing Sheets

DYNAMIC RANDOM ACCESS MEMORY DEVICE HAVING POWER SUPPLY SYSTEM APPROPRIATELY BIASING SWITCHING TRANSISTORS AND STORAGE CAPACITORS IN BURN-IN TESTING PROCESS

FIELD OF THE INVENTION

This invention relates to a semiconductor memory device and, more particularly, to a dynamic random access memory device having a power supply system appropriately biasing switching transistors and storage capacitors in burn-in testing process.

DESCRIPTION OF THE RELATED ART

The dynamic random access memory device has been increasing the integration density through miniaturization of the components, and, on the contrary, the dimensions of the memory cell have been decreased together with the minimum design rules. The memory cell is typically implemented by a series combination of a switching transistor and a storage capacitor, and the storage capacitor stores a data bit in the form of electric charges. Small real estate is assigned to the memory cell and, accordingly, to the storage capacitor, and the storage capacitor keeps the capacitance by decreasing the thickness of the dielectric film thereof under the miniaturization.

However, the extremely thin dielectric film tends to be damaged due to strong electric field applied thereacross. This is undesirable for the dynamic random access memory device, because the stored data bit is lost as leakage current. In order to prevent the storage capacitor from the strong electric field, a step-down voltage as small as a half of the internal power voltage level is applied to the cell plate of the storage capacitor, and, accordingly, decreases the electric field applied across the extremely thin dielectric film. Moreover, the miniaturization brings the component transistors to the hot-carrier problem, and the step-down voltage is effective against the problem. For this reason, an internal step-down power voltage is widely employed in 16 mega-bit dynamic random access memory devices and advanced memory devices, and various step-down voltage generators are incorporated in the dynamic random access memory devices.

However, a step-down power voltage is undesirable for a burn-in testing process, because the step-down power voltage is less effective against potential failure. In detail, the burn-in testing process actualizes potential failure in the early failure period, and is carried out by the manufacturer before delivery from the factory for enhancing the reliability of the products. In the burn-in testing process, excess voltage is applied to the circuit components of the dynamic random access memory device in high temperature atmosphere, and accelerates actualization of the potential failure. However, the built-in step-down voltage generator prohibits the circuit components from the excess voltage level in the burn-in testing process, and a power supply system is proposed for a variable internal step-down power voltage proportional to an external power voltage.

FIG. 1 illustrates a typical example of the dynamic random access memory device of the type having the variable internal step-down power supply system. The prior art dynamic random access memory device largely comprises a memory cell array 1, an addressing system 2, a data propagation system 3, a power supply system 4 and a controlling unit 5.

The memory cell array is implemented by a plurality of memory cells associated with word lines WL1, WL2, ,,, WL1 and WLm and bit line pairs BL1 to BLn. The memory cells are of the one-transistor and one-capacitor type, and small circles are representative of the memory cells in FIG. 1. The memory cells are arranged in rows and columns, and the word lines WL1 to WLm are respectively connected with the gate electrodes of the switching transistors in the associated rows. Each of the bit line pairs BL1 to BLn has two bit lines, and the drain nodes of the switching transistors in the associated columns are selectively connected with the bit lines of the associated bit line pairs BL1 to BLn.

The addressing system 2 comprises a row address decoder/word line driver 2a and a column address decoder/column selector 2b. The row address decoder/word line driver 2a is connected to the word lines WL1 to WLm, and is responsive to row address predecoded signals indicative of a row address assigned to one of the word lines WL1 to WLm for driving over an internal power voltage level Vint. The switching transistors connected with the selected word line turn on, and the bit line of the associated bit line pairs BL1 to BLn are electrically conducted with the storage capacitors of the selected row. As a result, potential differences indicative of stored data bits take place on the bit line pairs BL1 to BLn in a read-out mode, and data bits are stored in the storage capacitors in the form of electric charges in a write-in mode. The read-out mode and the write-in mode are hereinbefore referred to as "standard modes".

The column address decoder/column selector 2b is responsive to column address predecoded signals for selectively connecting the bit line pairs BL1 to BLn with input and output data buffers.

The data propagation system 3 has sense amplifiers 3a respectively connected with the bit line pairs BL1 to BLn, and the sense amplifiers develop the potential differences on the bit line pairs BL1 to BLn in both read-out and write-in modes.

The power supply system 4 is broken down into three sub-systems. The first sub-system supplies a step-down voltage to predetermined circuits as the internal power voltage Vint, and the sense amplifiers 3a form parts of the predetermined circuits. The second sub-system supplies a boosted voltage signal Pw to the word line drivers 2a, and the boosted voltage signal Pw is higher than the internal power voltage level Vint. Although not shown in FIG. 1, the third sub-system supplies an external power voltage Vext to preselected circuits such as, for example, the input and output data buffers, and the external power voltage Vext is higher than the internal power voltage Vint.

The first sub-system for producing the internal power voltage Vint comprises first and second reference voltage generators 4a and 4b arranged in parallel, a voltage detector 4c connected with the first reference voltage generator 4a, a switching circuit 4d having two input nodes respectively connected with the first and second reference voltage generators 4a and 4b and a step-down voltage generator 4e having a control node connected with the output node of the switching circuit 4d.

As shown in FIG. 2, the first reference voltage generator 4a produces a first primary reference voltage signal Vref1 from the external power voltage Vext, and FIG. 3 shows the input voltage-to-output voltage characteristics of the first reference voltage generator 4a. Namely, the first primary reference voltage signal Vref1 is proportional to the external power voltage Vext until a predetermined turning point Vr1. However, after the external power voltage Vext exceeds the predetermined turning point Vr1, the first primary reference voltage signal Vref1 is constant regardless of the external power voltage Vext.

The second reference voltage generator 4b produces a second primary reference voltage signal Vref2 from the external power voltage Vext as shown in FIG. 4. The second reference voltage generator 4b is implemented by a series of resistors R1 and R2 (see FIG. 5), and the second primary reference voltage signal Vref2 is produced at an intermediate node between the resistors R1 and R2. For this reason, the second primary reference voltage signal Vref2 is proportional to the external power voltage Vext over the whole range as will be seen in FIG. 6. The coefficient of the plots indicative of the second primary reference voltage signal Vref2 is given through a proportional allotment on the resistances r1 and r2 of the resistors R1 and R2, and the second primary reference voltage signal Vref2 is given by Equation 1.

$$Vref2 = \{R2/(R1+R2)\} \times Vext \quad \text{Equation 1}$$

When the coefficient is determined, relation between an external power voltage Vext' in the burn-in testing process and the internal power voltage Vint' produced therefrom is taken into account. Comparing FIG. 3 with FIG. 6, it is understood that the second primary reference voltage Vref2 is delayed from the first primary reference voltage signal Vref1 in an early stage of the transition toward the stable external power voltage Vext.

The voltage detector 4c monitors the external power voltage Vext to see whether or not the external power voltage Vext becomes high enough to use the second primary reference voltage signal Vref2 as a secondary reference signal Vref, and produces a control signal Ps as shown in FIG. 7 when a third primary reference voltage Vref3 exceeds the first primary reference voltage signal Vref1 as will be described hereinbelow.

The voltage detector 4c largely comprises a third reference voltage generator 4f for producing the third primary reference voltage signal Vref3, a current mirror circuit 4g for comparing the third primary reference voltage signals Vref3 with the first primary reference voltage signal Vref1, and an inverter 4h for producing the control signal Ps upon consistence between the first and third reference voltage signals Vref1 and Vref3 as shown in FIG. 8.

Namely, the third reference voltage generator 4f is implemented by a series of resistors R3 and R4, and the third reference voltage signal Vref3 is produced at an intermediate node between the resistors R3 and R4 as similar to the second reference voltage generator 4b. The third primary reference voltage signal Vref3 is given by Equation 2, and the third reference voltage signal Vref3 is also delayed with respect to the first reference voltage signal Vref1.

$$Vref3 = \{R4/(R3+R4)\} \times Vext \quad 2$$

The current mirror circuit 4g comprises two complementary inverters Qp1/Qn2 and Qp3/Qn4 connected in parallel between the external power voltage line Vext and a common node N1 and an n-channel enhancement type field effect transistor Qn5 connected between the common node N1 and the ground voltage line. The p-channel enhancement type field effect transistors Qp1 and Qp3 are controlled by the common drain node N2 between the p-channel enhancement type field effect transistor Qp1 and the n-channel enhancement type field effect transistor Qn2, and the n-channel enhancement type field effect transistors Qn2 and Qn4 are respectively controlled by the third and first primary reference voltage signals Vref3 and Vref1, respectively. The common drain node N3 between the p-channel enhancement type field effect transistor Qp3 and the n-channel enhancement type field effect transistor Qn4 is connected with the input node of the inverter 4h.

As shown in FIG. 9, the first primary reference voltage signal Vref1 rapidly reaches the constant voltage level, and the third primary reference voltage signal Vref3 pursues the first primary reference voltage signal Vref1. While the third primary reference voltage signal Vref3 is pursuing the first primary reference voltage signal Vref1, the p-channel enhancement type field effect transistor Qp3 allows a small amount of current, and the n-channel enhancement type field effect transistor is small in channel resistance. Then, the voltage level at the common drain node N3 is lower than the threshold level of the inverter 4h. For this reason, the inverter 4h causes the control signal Ps to keep high. However, when the third primary reference voltage signal Vref3 catches up the first primary reference signal Vref1, the voltage detector 4c assumes that the second primary reference voltage signal Vref2 becomes high enough to serve as the secondary reference voltage signal Vref, and the voltage level at the common drain node N3 exceeds the threshold level of the inverter 4h. As a result, the inverter 4h changes the control signal Ps to the active low voltage level.

Turning to FIG. 10, the switching circuit 4d comprises an inverter 4i for producing a complementary control signal CPs of the control signal Ps and two transfer gates 4j and 4k supplied with the first and second primary reference voltage signals Vref1 and Vref2, respectively, and the transfer gates 4j and 4k are respectively gated by the complementary control signal CPs and the control signal Ps.

While the control signal Ps keeps high, the complementary control signal CPs allows the transfer gate 4j to turn on, and the first primary reference voltage signal Vref1 serves as the secondary reference voltage signal Vref. However, when the voltage detector changes the control signal Ps to the active low voltage level, the transfer gate 4j turns off, and the transfer gate 4k turns on so that the second primary reference voltage signal Vref2 serves as the secondary reference signal Vref instead of the first primary reference voltage signal Vref1. In other words, when the second primary reference voltage signal Vref2 becomes high enough to serve as the secondary reference voltage signal Vref, the first primary reference voltage signal Vref1 is replaced with the second primary reference voltage signal Vref2.

Turning to FIG. 11, the step-down voltage generator 4e comprises a controller 4m responsive to the secondary reference voltage signal Vref, a p-channel enhancement type field effect transistor Qp6 coupled between the external power voltage line Vext and the internal power voltage line and a resistor R5 coupled between the internal power voltage line and the ground voltage line. The controller 4m produces the internal power voltage Vint from the external power voltage Vext in response to the secondary reference voltage signal Vref, and the external power voltage Vext is stepped down to the internal power voltage Vint.

Turning back to FIG. 1, the second sub-system of the power supply system 4 has a bootstrapping circuit 4n, and the internal power voltage level Vint is supplied to the bootstrapping circuit 4n for producing the boosted word line driving signal Pw. As shown in FIG. 12, the bootstrapping circuit 4n comprises a current amplifier 4m supplied with a boost control signal Pin from the controlling unit 5, a delay element 4o for producing a delayed boost control signal DPin and a bootstrap capacitor C1 connected between the output node of the current amplifier 4m and the output node of the delayed element 4o.

Assuming now that the controlling unit 5 supplies the boost controlling signal Pin to the current amplifier 4m at an appropriate timing t1 of FIG. 13 for driving a word line, the current amplifier 4m lifts the boosted word line driving signal Pw to the internal power voltage level Vint at time t2, and the delay element 4o introduces time delay T1 to the boosted control signal Pin, and supplies the delayed boosted control signal DPin to the bootstrap capacitor C1. Then, the boosted word line driving signal Pw is boosted over the internal power voltage Vint at time t3, and the boosted voltage level Vboot is given by Equation 3.

$$Vboot = \{1 + C1/(C1 + C6)\} vint \qquad \text{Equation 3}$$

where C1 is the capacitance of the bootstrap capacitor C1, C1 is a load capacitance coupled with the bootstrap capacitor C1 and a is a bootstrapping coefficient.

FIG. 14 shows a memory cell MC incorporated in the memory cell array 1, and the memory cell MC is implemented by a series combination of an n-channel enhancement type switching transistor SW and a storage capacitor SC. A word line WL is connected with the gate electrode of the n-channel enhancement type switching transistor SW, and a bit line BL of one of the bit line pairs BL1 to BLn is connected with the drain node of the n-channel enhancement type switching transistor SW. The counter electrode of the storage capacitor SC is connected with an intermediate voltage generator IMV, and the intermediate voltage generator IMV supplies the counter electrode an intermediate voltage Vint/2 as high as a half of the internal step-down power voltage level Vint. The gate oxide film of the n-channel enhancement type switching transistor SW and the dielectric film of the storage capacitor SC are different in thickness, and are 100 angstroms thick and 45 angstroms thick in this instance.

The boosted word line driving signal Pw on the word line WL is expected to restore the internal step-down power voltage level Vint on the bit line BL into the storage capacitor SC without any step-down due to the n-channel enhancement type switching transistor SW, and the boosted voltage level Vboot is adjusted to a value higher than the internal step-down power voltage Vint by at least the threshold level of the n-channel enhancement type switching transistor SW. For example, if the internal step-down power voltage level Vint and the threshold level of the n-channel enhancement type switching transistor SW are 2.3 volts and 1.7 volts, the boosted voltage level Vboot is not lower than 4.0 volts, and the bootstrapping coefficient a is given as 4.0/2.3 = 1.74.

After installation into an electronic system, the prior art dynamic random access memory device thus arranged stores data bits in the memory cell array I in a rewritable manner, and allows an external device to access the data bits. For example, when the external device accesses the data bit of logic "1" level equivalent to the internal step-down power voltage Vint on the bit line BL, the row address decoder/word line driver 2a energizes the word line WL to the boosted voltage level Vboot at an appropriate timing, and the n-channel enhancement type switching transistor SW turns on for conducting the bit line BL and the accumulating electrode of the storage capacitor SC. The bit line BL and the associated bit line (not shown) paired therewith have been already equalized, and the electric charges at the accumulating electrode produce potential difference between the bit line BL and the associated bit line. The potential difference is increased in magnitude by means of the associated sense amplifier 3a, and the bit line BL and the associated bit line reach the internal step-down power voltage level Vint and the ground voltage level, respectively. The stored data bit in the form of potential difference is propagated to the input/output data buffers (not shown), and an output data signal indicative of the stored data bit is supplied to the external device.

The internal step-down power voltage Vint on the bit line BL passes through the n-channel switching transistor SW without any substantial step-down, and is accumulated in the storage capacitor SC again.

The secondary reference signal Vref traces Plots Vref1/ Vref and Vref2/ Vref of FIG. 15, and the manufacture recommends range R1 between voltage levels Vy and Vx for the practical usage in the electronic system. As described hereinbefore, the prior art dynamic random access memory device is subjected to the inspection through the burn-in testing process, and the external power voltage Vext is replaced with a test power voltage Vtest higher than the external power voltage Vext. In the burn-in testing process, the testing power voltage Vtest is regulated to a certain value in the voltage range R2, and the internal power voltage level Vint and the boosted word line driving level Pw are elevated over those in the practical usage. As a result, stresses are applied to the gate oxide film of the n-channel enhancement type switching transistor SW and the dielectric film of the storage capacitor SC.

However, a problem is encountered in the prior art dynamic random access memory device in that the burn-in testing process can not perfectly screen out potential defects of the storage capacitor SC, and the prior art dynamic random access memory device suffers from a low reliability of the storage capacitors. This is because of the fact that the prior art power supply system can not stress the dielectric film of the storage capacitor SC. In detail, if the burn-in testing process is carried out under the maximum accelerating electric field Emax, which is larger than a recommendable electric field Erec in the standard modes by 2MV/cm, the gate oxide film of the n-channel enhancement type switching transistor SW and the dielectric film of the storage capacitor SC are biased under the internal step-down power voltage level Vint as shown in the right column of Table 1. However, the recommendable range R1 for the practical usage results in the left column of Table 1, and the internal step-down power voltage Vint, the boosted voltage level Vboot on the word line WL, the bootstrapping coefficient a, the thickness of the gate oxide film and the thickness of the dielectric film are assumed to be 2.3 volts, 4.0 volts, 1.74, 100 angstroms and 45 angstroms.

TABLE 1

| | Applied electric field under the range R1 | Bias conditions under Emax = Erec + 2 MV/cm |
|---|---|---|
| Gate oxide film = 100 angstroms | 4.0 MV/cm | Vint = 3.45 volts (Pw = 6 volt) |
| Dielectric film = 45 angstroms | 2.6 MV/cm | Vint = 4.14 volts |

As will be understood from the right column, when the internal step-down power voltage Vint is 3.45 volts, the gate oxide film of the n-channel enhancement type switching transistor SW reaches the maximum accelerating electric field Emax, but the dielectric film of the storage capacitor SC does not reach the maximum acceleration in electric field Emax under the same condition. In other words, even if the gate oxide film is sufficiently stressed in the burn-in testing process, the acceleration is too small to screen out the potential defects of the storage capacitor SC. Such an insufficient bias is causative of the low reliability of the prior art dynamic random access memory device.

In order to improve the reliability of the prior art dynamic random access memory device, a switching transistor Qn7 is inserted between the intermediate voltage generator IMV and the ground voltage line, and the switching transistor Qn7 is switched with the control signal CLs. Namely, while the dynamic random access memory device is subjected to the inspection through the burn-in testing process, the control signal CLs goes up to the high voltage level, and an inverter INV1 shifts the switching transistor Qn7 to off-state. For this reason, the ground voltage level is applied to the cell plate of the storage capacitor SC in the burn-in testing process, and the dielectric film is biased under the increased electric field. However, when the internal step-down power voltage level Vint is regulated to 3.45 volts, the dielectric film of the storage capacitor SC is biased in the electric field of 3.45 [volts]/ 45 [angstroms]=7.7 MV/cm, and the electric field is too large to appropriately stress the dielectric film. The excess electric field damages the excellent dielectric film of the storage capacitor SC, and the prior art dynamic random access memory device suffers from low production yield.

SUMMARY OF THE INVENTION

It is therefore an important object of the present invention to provide a dynamic random access memory device which allows a burn-in testing process to screen out potential defects without any damage to an excellent storage capacitor.

To accomplish the object, the present invention proposes to change a ratio of a boosted voltage level to a step-down power voltage between standard modes and a burn-in testing process.

In accordance with the present invention, there is provided a dynamic random access memory device selectively entering standard modes for selectively accessing data bits and a testing mode for a burn-in testing process, comprising: a) a plurality of addressable memory cells arranged in rows and columns, and respectively storing the data bits, each of the plurality of addressable memory cells being implemented by a switching transistor and a storage capacitor connected in series; b) a plurality of word lines respectively associated with the rows of addressable memory cells, and connected with gate electrodes of the switching transistors in the associated rows; c) a plurality of bit line pairs respectively associated with the columns of addressable memory cells, and having bit lines selectively connected with the drain nodes of the switching transistors in the associated columns; d) a row address decoder and word line driver unit connected with the plurality of word lines, and lifting one of the plurality of word lines to a boosted voltage level for conducting accumulating electrodes of the storage capacitors through the switching transistors with the bit lines of the plurality of bit line pairs; e) a plurality of sense amplifier circuits respectively connected with the plurality of bit line pairs, and operative to increase potential differences indicative of data bits in magnitude so that the bit lines of the plurality of bit line pairs selectively go to a step-down power voltage level and a low voltage level; f) an intermediate voltage generating unit producing an intermediate voltage level from the step-down power voltage, and supplied to counter electrodes of the storage capacitors; and g) a power supplying system supplied with a regular power voltage level from the outside of the dynamic random access memory device, and having g-1) a first sub-system responsive to a first control signal for producing the step-down power voltage level from the regular power voltage level; and distributing the step-down power voltage level to at least the plurality of sense amplifier circuits and the intermediate voltage generating unit, the step-down power voltage being constant while the regular power voltage ranges from a first predetermined voltage level to a second predetermined voltage level, the step-down power voltage being proportional to and lower than the regular power voltage level after the regular power voltage level exceeds the second predetermined voltage level, g-2) a first voltage detecting circuit monitoring the step-down power voltage level to see whether or not the regular power voltage level exceeds the second predetermined voltage level for producing the first control signal indicative of the regular power voltage level over the second predetermined voltage level, and g-3) a second sub-system producing the boosted voltage level for distributing the boosted voltage level to at least the row address decoder and word line driver unit, and regulating the boosted voltage level first predetermined times larger than the step-down power voltage while the regular power voltage is ! lower than the second predetermined voltage level, the second sub-system being further operative to regulate the boosted voltage level second predetermined times larger than the step-down power voltage level after the regular power voltage level exceeds the second predetermined voltage level, the first predetermined times being different from the second predetermined times, the regular power voltage level being lower than the second predetermined voltage level in the standard modes and higher than the second predetermined voltage level in the burn-in testing process.

BRIEF DESCRIPTION OF THE DRAWINGS

The features and advantages of the dynamic random access memory device according to the present invention will be more clearly understood from the following description taken in conjunction with the accompanying drawings in which.

DESCRIPTION OF THE PREFERRED EMBODIMENTS

First Embodiment

Figure 17:
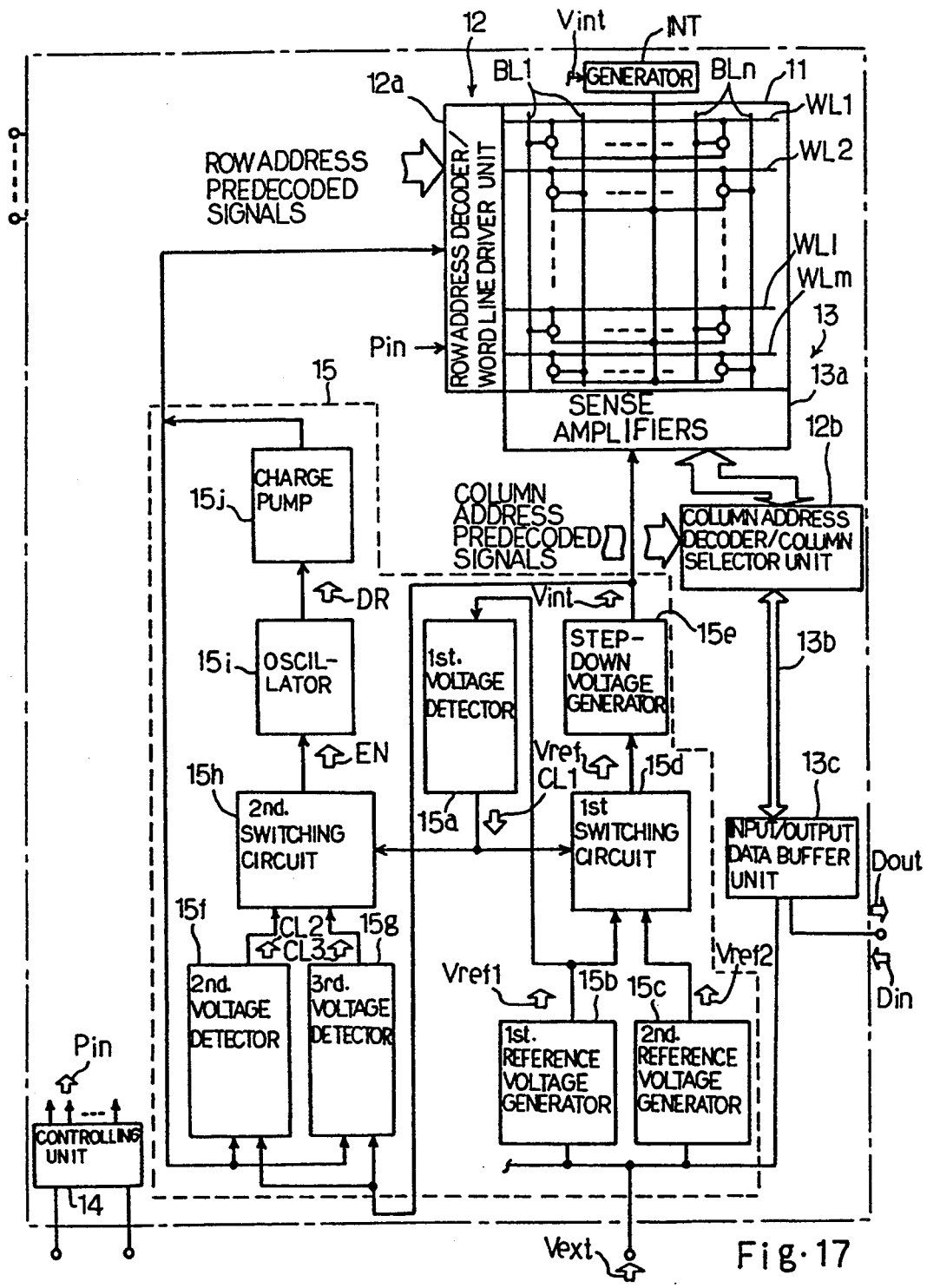
FIG. 17 is a block diagram showing the arrangement of a dynamic random access memory device according to the present invention.

Referring to FIG. 17 of the drawings, a dynamic random access memory device embodying the present invention largely comprises a memory cell array 11, an addressing system 12, a data propagating system 13, a controlling unit 14 and a power supply system 15.

Figure 1:
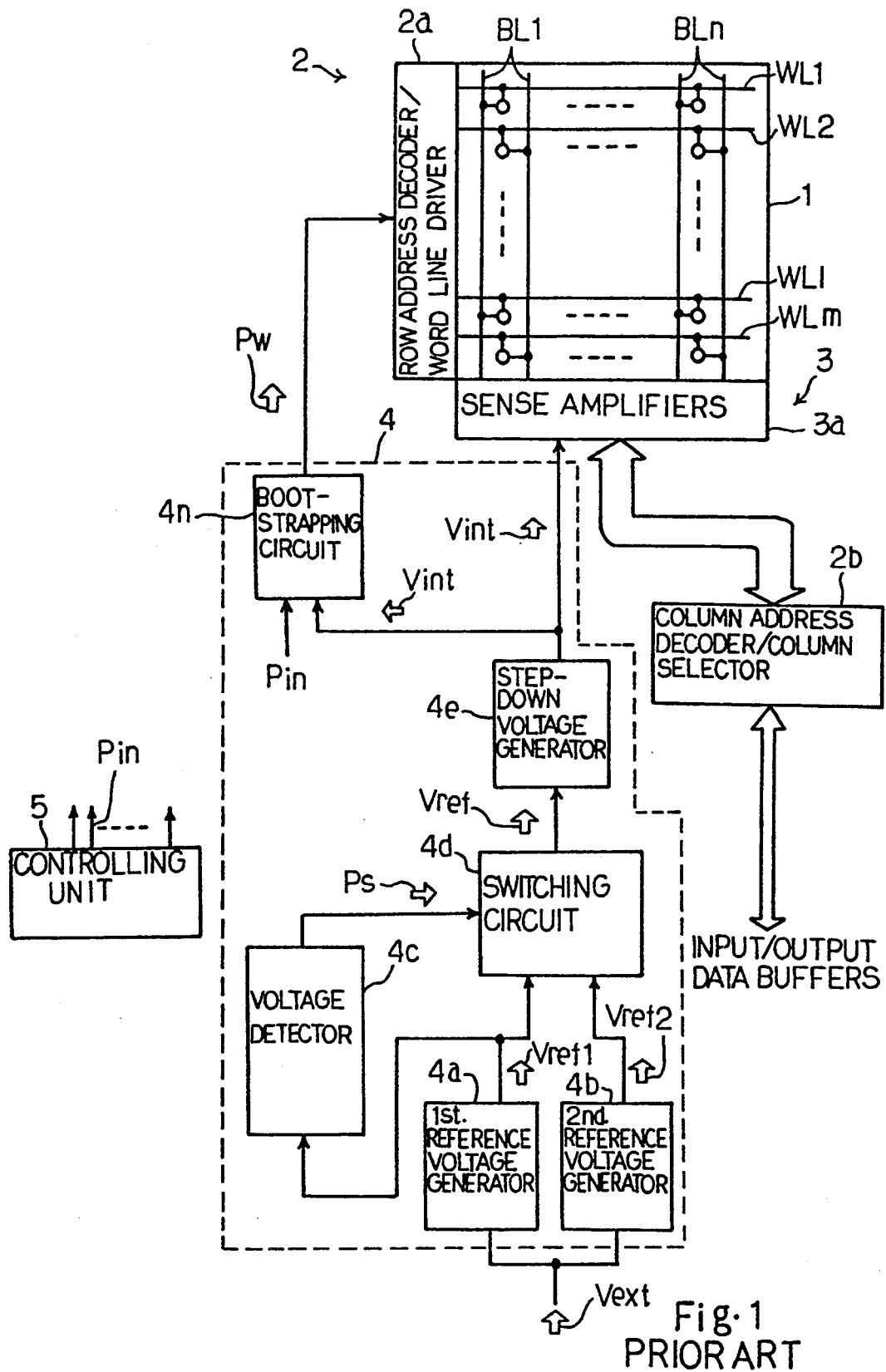
FIG. 1 is a block diagram showing the general arrangement of the prior art dynamic random access memory device.
Figure 2:
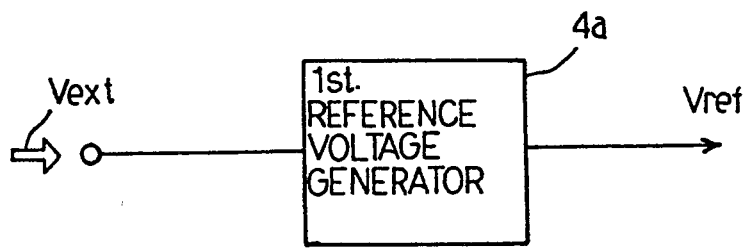
FIG. 2 is a block diagram showing the first reference voltage generator incorporated in the prior art dynamic random access memory device.
Figure 3:
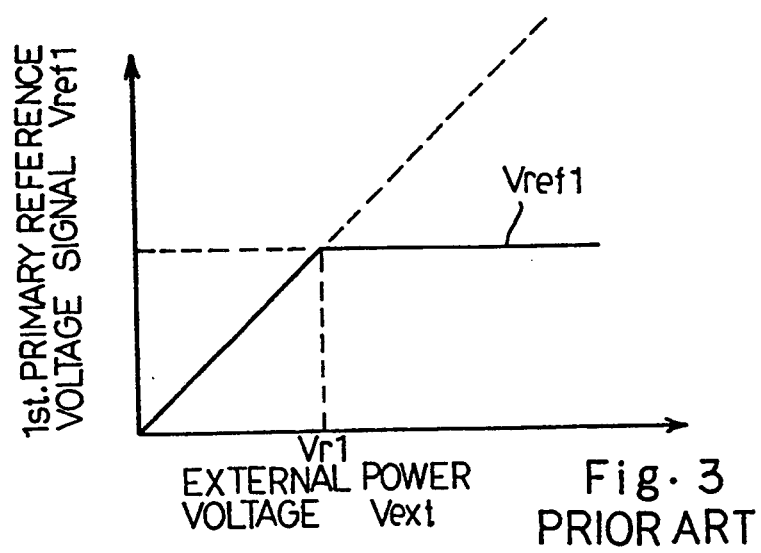
FIG. 3 is a graph showing the input voltage-to-output voltage characteristics of the first reference voltage generator.
Figure 4:
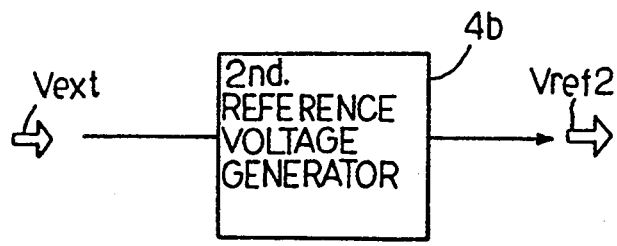
FIG. 4 is a block diagram showing the second reference voltage generator incorporated in the prior art dynamic random access memory device.
Figure 5:
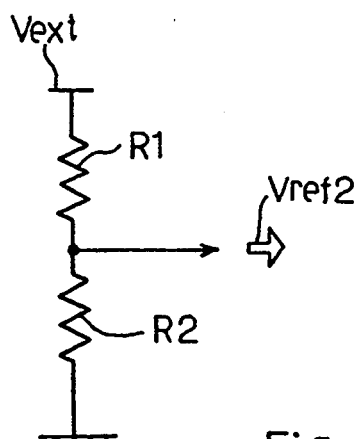
FIG. 5 is a circuit diagram showing the second reference voltage generator.
Figure 6:
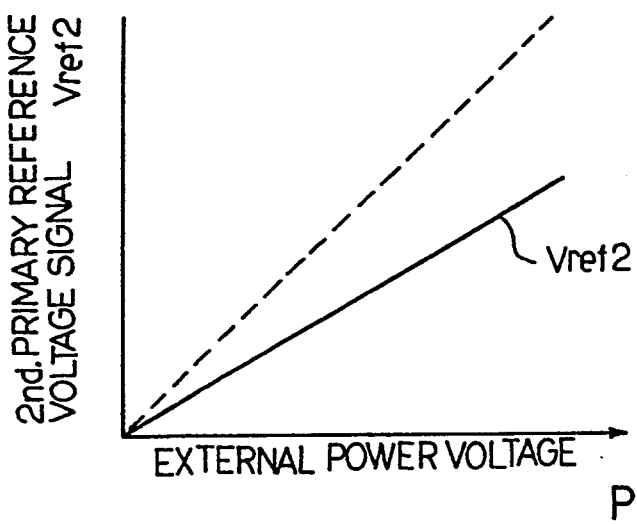
FIG. 6 is a graph showing the input voltage-to-output voltage characteristics of the second reference voltage generator.
Figure 7:
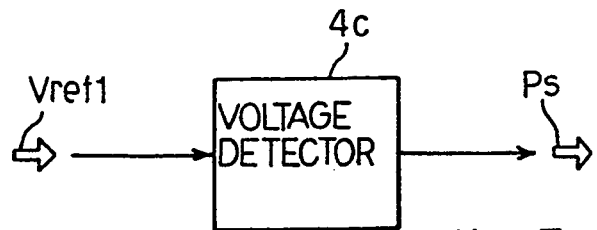
FIG. 7 is a block diagram showing the voltage detector incorporated in the prior art dynamic random access memory device.
Figure 8:
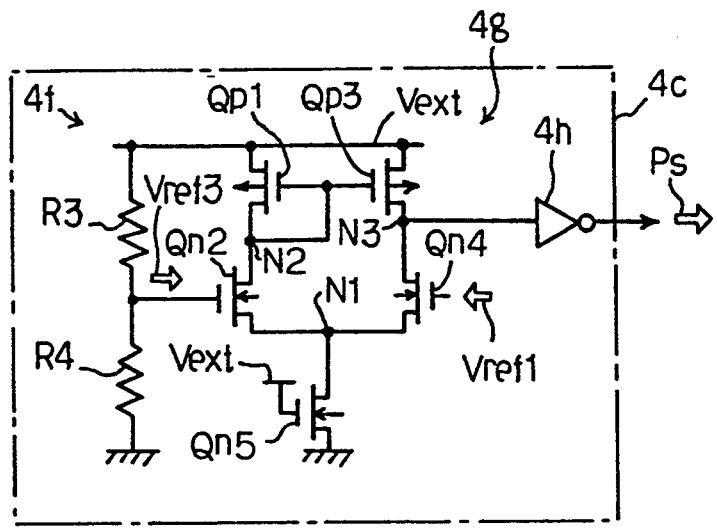
FIG. 8 is a circuit diagram showing the arrangement of the voltage detector.
Figure 9:
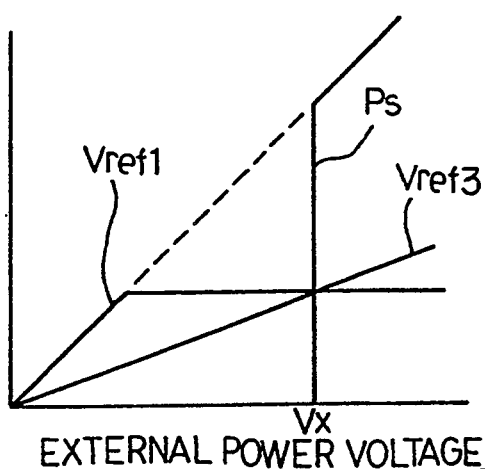
FIG. 9 is a graph showing the control signal produced by the voltage detector in terms of an external power voltage.
Figure 10:
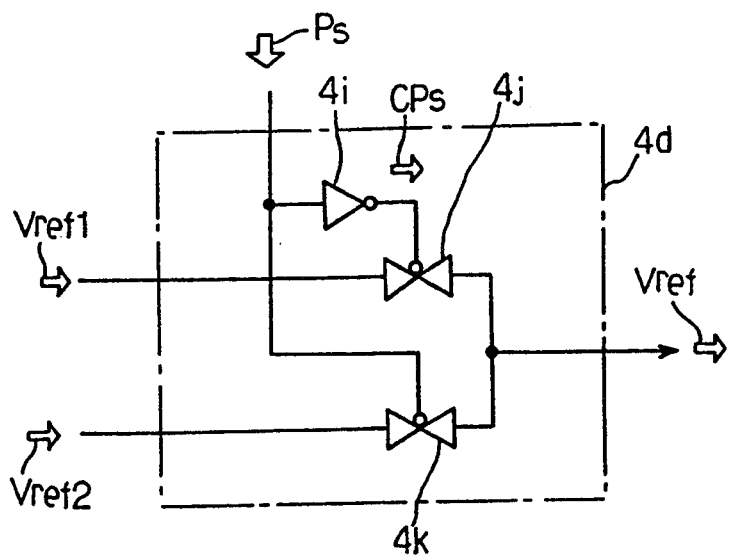
FIG. 10 is a circuit diagram showing the arrangement of a switching circuit incorporated in the prior art dynamic random access memory device.
Figure 11:
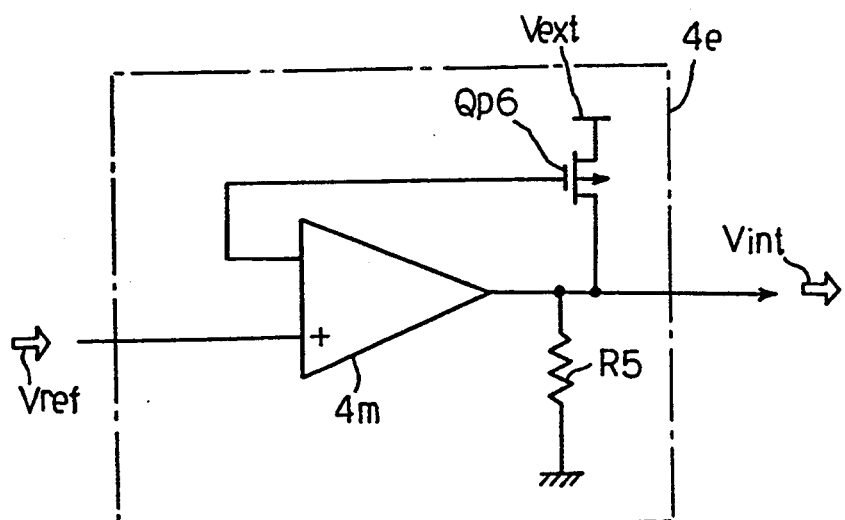
FIG. 11 is a circuit diagram showing the step-down voltage generator incorporated in the prior art dynamic random access memory device.
Figure 12:
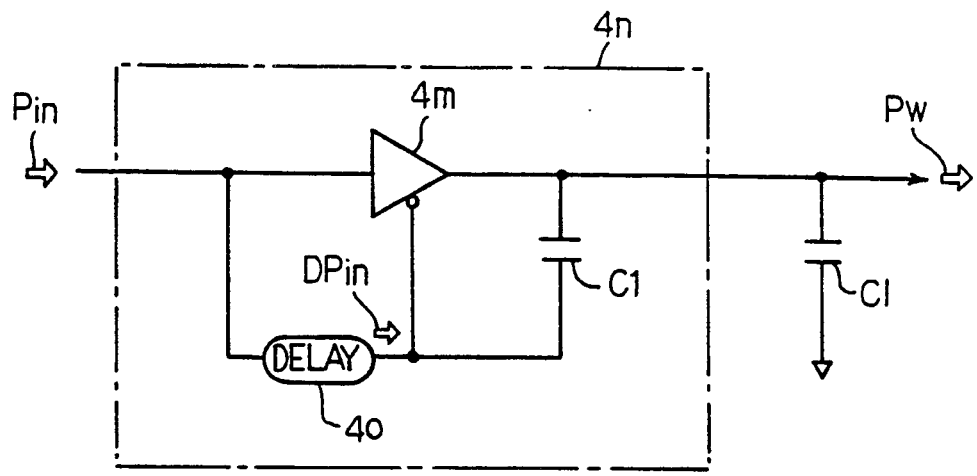
FIG. 12 is a circuit diagram showing the arrangement of the bootstrapping circuit incorporated in the prior art dynamic random access memory device.
Figure 13:
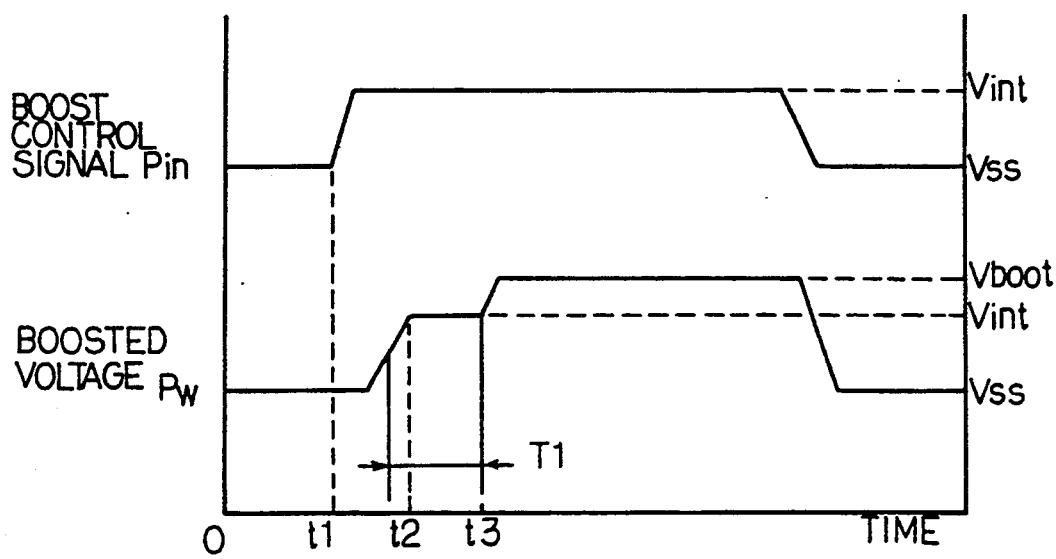
FIG. 13 is a graph showing the bootstrapping phenomenon.
Figure 14:
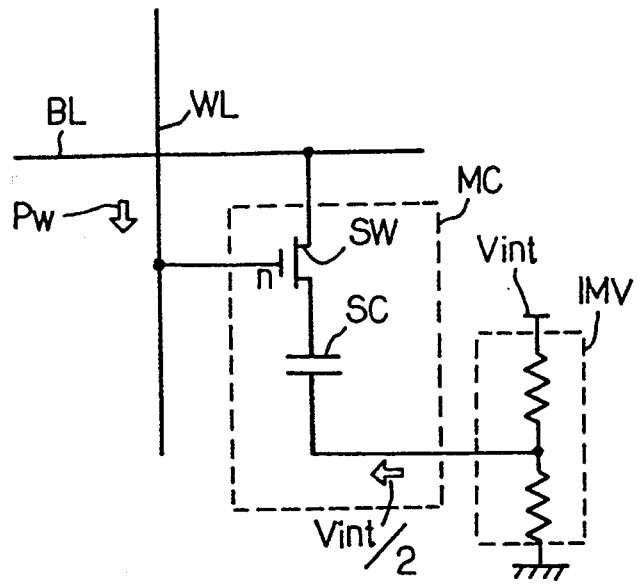
FIG. 14 is a circuit diagram showing the arrangement of the memory cell, the word line, the bit line and the intermediate voltage generator incorporated in the prior art dynamic random access memory device.
Figure 15:
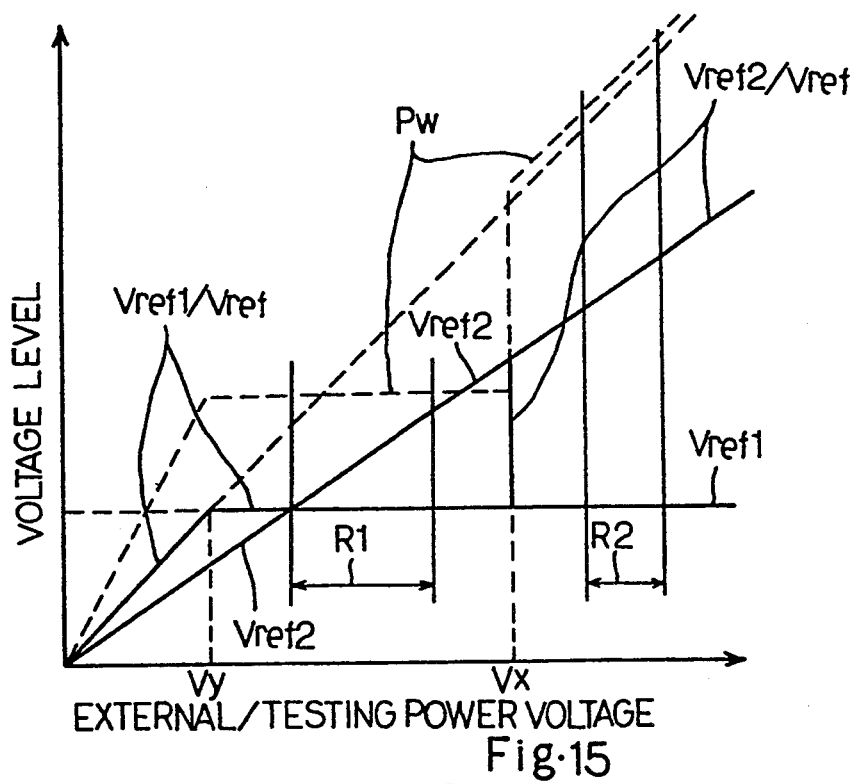
FIG. 15 is a graph showing the relation between the external/ testing power voltage level and the boosted voltage level for the word lines.
Figure 16:
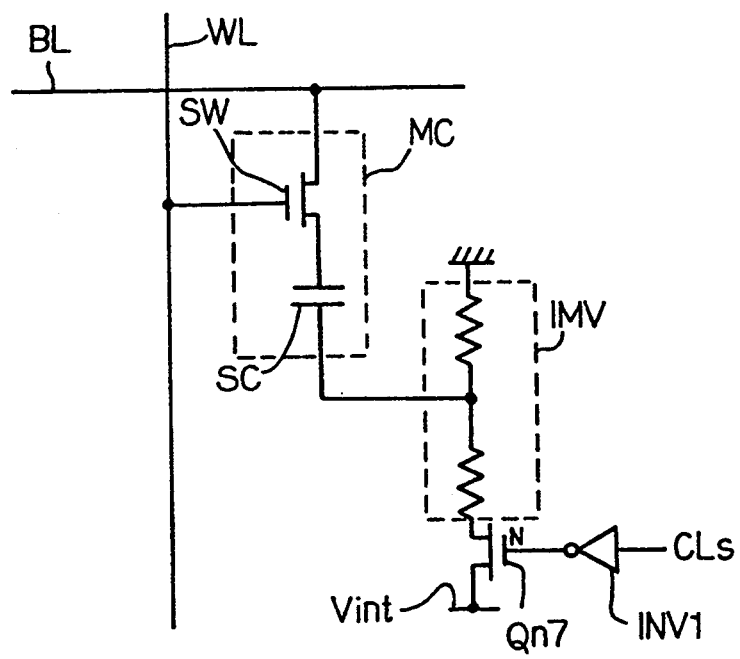
FIG. 16 is a circuit diagram showing another prior art intermediate voltage generator connected with the cell plate of the storage capacitor.

The memory cell array 11 is implemented by a plurality of memory cells associated with word lines WL1, WL2,..., WL1 and WLm and with bit line pairs BLi to BLn, and small circles are indicative of the respective memory cells. The memory cells are arranged in rows and columns, and are of the one-transistor and one-capacitor type. Namely, each of the memory cells is implemented by a series of an n-channel enhancement type switching transistor and a storage capacitor as similar to the prior art memory cell. The word lines WL1 to WLm are respectively associated with the rows of memory cells, and are connected with the gate electrodes of the n-channel enhancement type switching transistors in the associated rows. The bit line pairs BL1 to BLn are respectively associated with the columns of memory cells, and the drain nodes of the n-channel enhancement type switching transistors are selectively connected with the bit lines of the associated bit line pairs BL1 to BLn. The connection between the n-channel enhancement type switching transistor, the storage capacitor, the associated word line and the associated bit line is similar to that of the prior art dynamic random access memory device shown in FIG. 14.

An intermediate voltage generator INT is connected with the cell plates of the storage capacitors of all the memory cells, and supplies an intermediate voltage level regulated to a half of an internal step-down power voltage Vint to the cell plates of the storage capacitors. Row addresses are respectively assigned to the rows of memory cells and, accordingly, to the word lines WL1 to WLm, and column addresses are respectively assigned to the columns of memory cells and to the bit line pairs BL1 to BLn.

The memory cells respectively store data bits in the form of electric charge, and the data bits produce potential differences on the associated bit line pairs BL1 to BLn.

The addressing system comprises a row address decoder/word line driver unit 12a and a column address decoder/ column selector unit 12b. The row address decoder/word line driver unit 12a is responsive to row address predecoded signals produced from external row address bits (not shown) indicative of one of the row addresses, and supplies a boosted word line driving signal to the word line assigned the row address. The column address decoder/column selector unit 12b is responsive to column address predecoded signals produced from external column address bits (not shown) indicative of one of the column addresses, and selects one of the bit line pairs BL1 to BLn for transferring a data bit therethrough.

The data propagating system 13 comprises sense amplifiers 13a, a data bus 13b and an input/output data buffer unit 13c. The sense amplifiers 13a are respectively connected with the bit line pairs BL1 to BLn, and develop potential differences on the bit line pairs BL1 to BLn. In this instance, the bit lines of each bit line pair are respectively stepped up and down to the internal step-down power voltage Vint and the ground voltage level through the differential amplification. The data bus 13b is connected with the output port of the column address decoder/ column selector unit 12b, and propagates the selected data bit to the input/output data buffer unit 13c. The input/output data buffer unit 13c produces an output data signal Dout from the potential difference indicative of the selected data bit in a read-out mode, and produces a potential difference from an input data bit Din in a write-in mode.

The controlling unit 14 is responsive to external control signals for sequentially producing internal control signals, and the internal control signals control a read-out sequence in the read-out mode and a write-in sequence in the write-in mode, by way of example.

The power supply system 15 largely broken down into three sub-systems. One of the sub-systems distributes an external power voltage Vext to predetermined units, and the input/ output data buffer unit 13c is one of the predetermined units. In this instance, the external power voltage level Vext serves as a regular power voltage level. A first voltage detector 15a is shared between the other two sub-systems, and forms a part of the power supply system 15.

The second sub-system produces the internal step-down power voltage Vint from the external power voltage Vext, and comprises a first reference voltage generator 15b, a second reference voltage generator 15c, a first switching circuit 15, a first switching circuit 15d and a step-down voltage generator 15e. The first voltage detector 15a, the first reference voltage generator 15b, the second reference voltage generator 15c, the first switching circuit 15d and the step-down voltage generator 15e are similar to those of the prior art dynamic random access memory device, and are briefly described hereinbelow.

The first reference voltage generator 15b produces a first primary reference voltage signal Vref1 from the external power voltage Vext, and the first primary reference voltage signal Vref1 varies as similar to that of the prior art. Namely, the first primary reference signal Vref1 rises in proportion to the external power voltage Vext until a voltage level Vy, and keeps the voltage level Vy after the external power voltage Vext exceeds the voltage level Vy.

The second reference voltage generator 15c produces a second primary reference voltage signal Vref2 from the external power voltage Vext, and the second primary reference voltage signal Vref2 rises together with the external power voltage Vext with a potential gap as similar to that of the prior art.

The first voltage detector 15a monitors the first primary reference voltage signal Vref1, and produces a control signal CL1 when the external power voltage Vext exceeds a voltage level Vx.

The first switching circuit 15d is responsive to the control signal CL1 for selectively transferring the first and second primary reference signals Vref1 and Vref2 as a secondary reference signal Vref. Namely, while the external power voltage Vext is rising toward the voltage level Vx, the first switching circuit 15d transfers the first primary reference voltage signal Vref1 to the step-down voltage generator 15e, and the secondary reference signal Vref2 keeps the voltage level Vy in the absence of the control signal CL1. After the external power voltage Vext exceeds the voltage level Vx, the first switching circuit 15d transfers the second primary reference voltage signal Vref2 to the step-down voltage generator 15e in response to the control signal CL1, and the secondary reference voltage signal Vref follows the external power voltage Vext with the potential gap.

The step-down voltage generator 15e is responsive to the secondary reference voltage signal Vref, and produces the internal step-down power voltage Vint from the external power voltage Vext. The internal step-down power voltage Vint is distributed to predetermined circuits such as the third sub-system, the sense amplifiers 13a and an intermediate voltage generator INT connected with the cell plates of the storage capacitors. The intermediate voltage generator INT supplies an intermediate voltage level between the step-down power voltage level Vint and the ground voltage level to the cell plates.

Thus, the second sub-system is similar to the prior art sub-system, and the voltage levels Vy and Vx serve as first and second predetermined voltage levels.

The third sub-system produces a boosted voltage Vboot from the internal step-down power voltage Vint, and comprises a second voltage detector 15f, a third voltage detector 15g, an oscillator 15i and a charge pump 15j.

Figure 18:
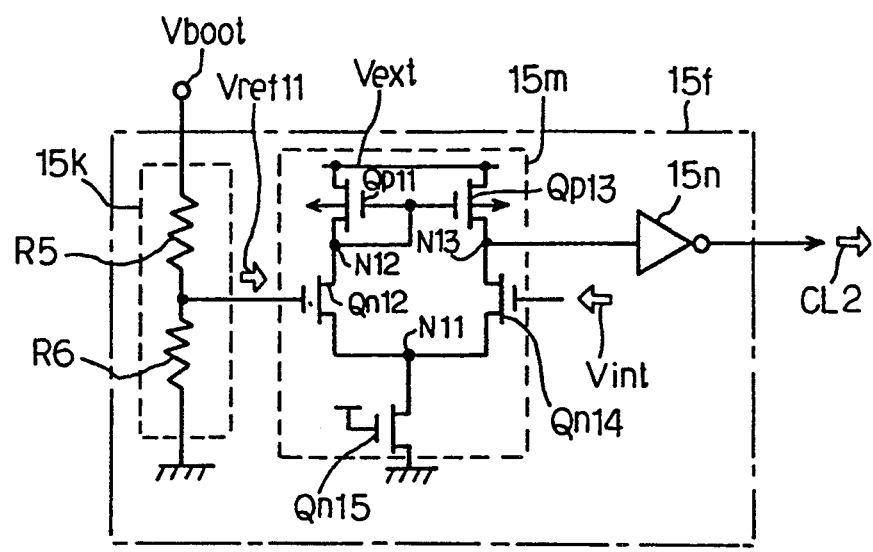
FIG. 18 is a circuit diagram showing the arrangement of a second voltage detector incorporated in the dynamic random access memory device according to the present invention.

The second voltage detector 15f is arranged as shown in FIG. 18. Namely, the second voltage detector 15f largely comprises a reference voltage generator 15k for producing a reference signal Vref11 from the boosted voltage Vboot, a current mirror circuit 15m for comparing the reference signal Vref11 with the internal step-down power voltage Vint, and an inverter 4h for producing a second control signal CL2.

In detail, the reference voltage generator 15k is implemented by a series of resistors R5 and R6, and the reference voltage signal Vref11 is produced at an intermediate node between the resistors R5 and R6. The reference voltage signal Vref11 is given by Equation 4.

$$Vref11 = \{R6/(R5+R6)\} \times Vboot \qquad \text{Equation 4}$$

The current mirror circuit 15m comprises two complementary inverters Qp11/Qn12 and Qp13/Qn14 connected in parallel between the external power voltage line Vext and a common node N11 and an n-channel enhancement type field effect transistor Qn15 connected between the common node N11 and the ground voltage line. The p-channel enhancement type field effect transistors Qp11 and Qp13 are controlled by the common drain node N12 between the p-channel enhancement type field effect transistor Qp11 and the n-channel enhancement type field effect transistor Qn12, and the n-channel enhancement type field effect transistors Qn12 and Qn14 are respectively controlled by the reference voltage signal Vref11 and the internal step-down power voltage Vint, respectively. The common drain node N13 between the p-channel enhancement type field effect transistor Qp13 and the n-channel enhancement type field effect transistor Qn14 is connected with the input node of the inverter 15n.

The reference voltage signal Vref11 is proportional to the boosted voltage level Vboot, and, accordingly, serves as a representative of the boosted voltage level Vboot. While the reference voltage signal Vref11 is pursuing the internal step-down voltage level Vint, the n-channel enhancement type field effect transistor Qn14 provides small resistance against the current passing therethrough, and the voltage level at the common drain node N13 is lower than the threshold level of the inverter 15n. For this reason, the inverter 4h causes the control signal CL2 to keep high. However, when the reference voltage signal Vref11 catches up the internal step-down power voltage Vint, the voltage level at the common drain node N13 exceeds the threshold level of the inverter 15n. As a result, the inverter 15n changes the control signal CL2 to the low voltage level.

The third voltage detector 15g is similar in arrangement to the second voltage detector 15f except for the ratio between resistances of the reference voltage generator, and a reference voltage signal Vref12 of the third voltage detector 15g is given by Equation 5.

$$Vref12 = \{R8/(R7+R8)\} \times Vboot \qquad \text{Equation 5}$$

where R7 and R8 are the resistances of the resistors corresponding to the resistors R5 and R6. The reference voltage signal Vref12 is also representative of the boosted voltage level Vboot, but the ratio between the reference voltage signal Vref11 and the boosted voltage level Vboot is different from the ratio between the reference voltage signal Vref12 and the boosted voltage level Vboot. While the reference voltage signal Vref12 is lower than the internal step-down power voltage Vint, the third voltage detector 15g produces a third control signal CL3 of the high voltage level. After the reference voltage signal Vref12 catches up and exceeds the internal step-down power voltage level Vint, the third voltage detector 15g changes the third control signal CL3 to the low voltage level.

The second switching circuit 15h is similar in arrangement to the first switching circuit 15d, and supplies one of the second and third control signals Vref11 and Vref12 as an enable signal EN. Namely, while the external power voltage level Vext is equal to or lower than the voltage level Vx, the second switching circuit 15h supplies the second control signal CL2 as the enable signal EN. However, after the external power voltage level Vext exceeds the voltage level Vx, the second switching circuit 15i supplies the third control signal CL3 as the enable signal EN.

Figure 19:
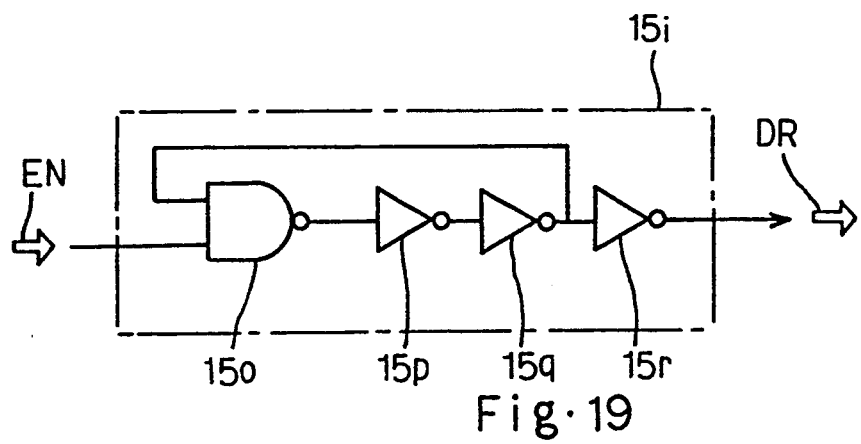
FIG. 19 is a circuit diagram showing the arrangement of an oscillator incorporated in the dynamic random access memory device according to the present invention.

Turning to FIG. 19 of the drawings, the oscillator 15i comprises a NAND gate 15o and a series of inverters 15p, 15q and 15r, and the inverters 15p and 15q introduce a time delay into a feedback signal to the NAND gate 15o. The enable signal EN is supplied to the NAND gate 15o, and the NAND gate 15o oscillates while the enable signal EN keeps high. As a result, the inverter 15r supplies a driving pulse signal DR to the charge pump 15j.

Figure 20:
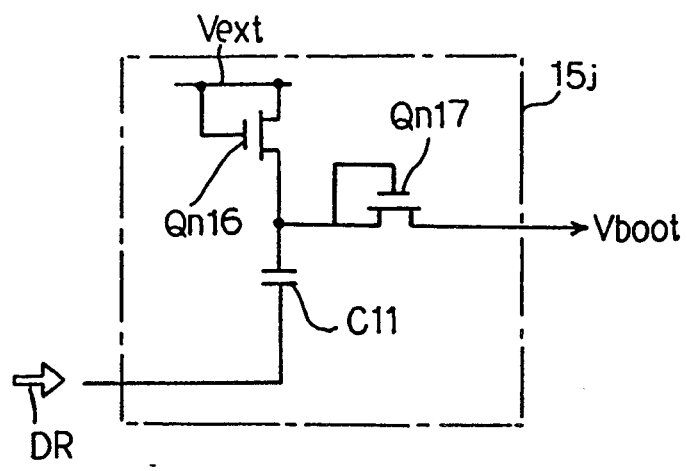
FIG. 20 is a circuit diagram showing the arrangement of a bootstrapping circuit incorporated in the dynamic random access memory device according to the present invention.

As shown in FIG. 20, the charge pump 15j comprises an n-channel enhancement type charge transistor Qn16 connected with the external power voltage line Vext, a capacitor C11 connected with the drain node of the charge transistor Qn16 and an n-channel enhancement type gate transistor Qn17 connected with the drain node of the charge transistor Qn16, and the driving pulse signal DR is applied to the opposite electrode of the capacitor C11. The charge pump 15j thus arranged causes the boosted voltage level Vboot to rise while the driving pulse signal DR is being supplied to the capacitor C11.

Thus, one of the second and third voltage detectors 15f and 15g, the second switching circuit 15h, the oscillator 15i and the charge pump 15j form in combination a feedback loop for keeping the boosted voltage level vboot constant. As described hereinbefore, the second and third voltage detectors 15f and 15g change the second and third control signals CL2 and CL3 at different boosted voltage level Vboot, and, for this reason, the ratio of the boosted voltage level Vboot to the internal step-down power voltage level Vint is variable depending upon the external power voltage level Vext. In other words while the external power voltage level Vext is equal to or lower than the voltage level Vx, the boosted voltage level Vboot is first predetermined times higher than the internal step-down power voltage level Vint. However, after the external power voltage level Vext exceeds the voltage level Vx, the boosted voltage level Vboot is second predetermined times higher than the internal step-down power voltage level Vint. The ration R between the first predetermined times and the second predetermined times is expressed as Equation 6.

$$R = \{R5/(R5+R6)\} : \{R7/(R7+R8)\} \qquad \text{Equation 6}$$

Figure 21:
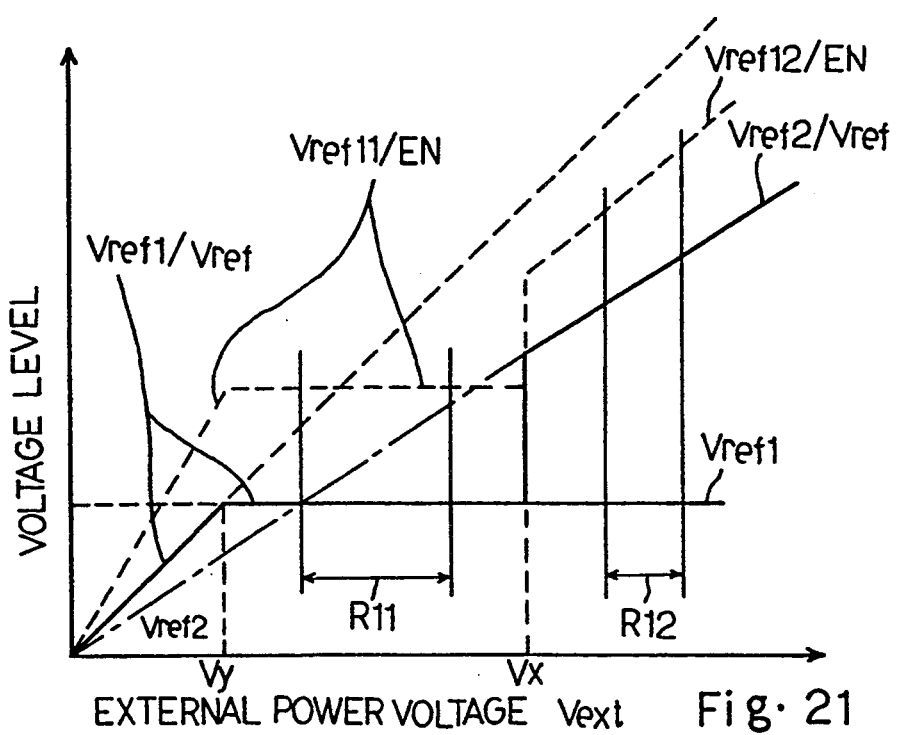
FIG. 21 is a graph showing a boosted word line driving signal in terms of an external power voltage.

Thus, the feedback loop changes the ratio between the boosted voltage level Vboot and the internal step-down power voltage level Vint at the voltage level Vx, and the enable signal EN is variable together with the internal power voltage level Vint as shown in FIG. 21. While the dynamic random access memory device is staying in the standard modes, i.e, the read-out and write-in modes the external power voltage level Vext is regulated to a certain level in a voltage range R11. However, when the dynamic random access memory device is subjected to an inspection through the burn-in testing process, the external voltage level Vext is lifted to a certain level in a voltage range R12. The manufacture takes the threshold level of the n-channel enhancement type switching transistors of the memory cells into account, and determines the internal step-down power voltage level Vint and the boosted voltage level Vboot in the standard modes. When the internal step-down power voltage Vint and the boosted voltage level Vboot are determined, the manufacturer regulates the resistances R5 and R6 for regulating the ratio between the internal step-down power voltage level Vint and the boosted voltage level Vboot. On the other hand, the manufacture takes the maximum accelerating electric field Emax across the gate insulating film of the switching transistor and the dielectric film of the storage capacitor into account, and determines the internal step-down power voltage level Vint and the boosted power voltage level Vboot in the burn-in testing process. When the internal step-down power voltage Vint and the boosted power voltage level Vboot are determined for the burn-in testing process, the manufacturer regulates the resistances R7 and R8.

For example, if the maximum accelerating electric field Emax is (Erec +2 MV/ cm), the internal step-down power voltage level Vint and the boosted voltage level Vboot should be regulated to 4.14 volts and 6.0 volts, respectively. The manufacturer sets the resistances R7 and R8 to appropriate values, and the internal step-down power voltage Vint and the boosted voltage level Vboot are expressed by Equations 7 and 8.

$$Vint = \{R2 / (R1+R2)\}Vext \qquad \text{Equation 7}$$

$$Vboot = \{(R7+R8)/R8\}Vint \qquad \text{Equation 8}$$

In this instance, the ratio $\{R2/(R1+R2)\}$ and the ratio $\{(R7+R8)/R8\}$ are 0.828 and 1.45.

Thus, the internal step-down power voltage Vint and the boosted voltage level Vboot are independently regulated between the standard modes and the burn-in testing process, and potential defects are perfectly actualized in the burn-in testing process. This results in enhancement of reliability of the dynamic random access memory device.

Second Embodiment

Figure 22:
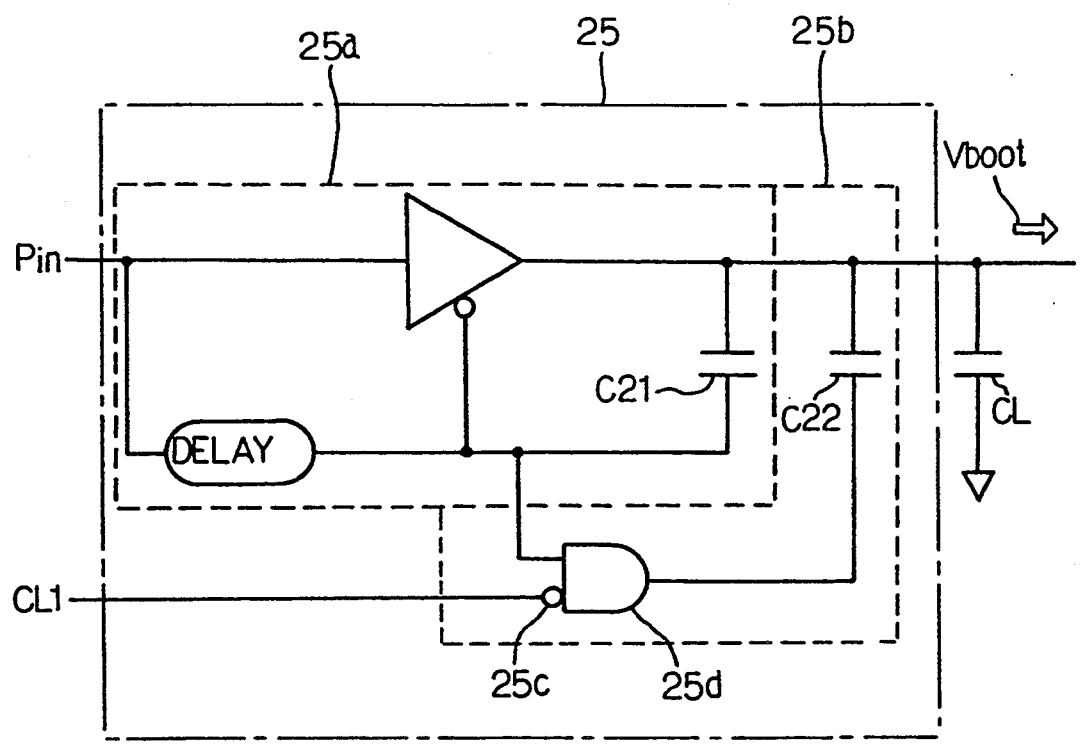
FIG. 22 is a circuit diagram showing the arrangement of a bootstrapping circuit incorporated in another dynamic random access memory device according to the present invention.

Turning to FIG. 22 of the drawings, a booster unit 25 incorporated in another dynamic random access memory device is illustrated, and serves as the third sub-system for producing a boosted voltage level Vboot. However, the other components are similar to those of the first embodiment.

The booster unit 25 comprises a bootstrapping circuit 25a with a main bootstrap capacitor C21 and an auxiliary booster circuit 25b with an auxiliary capacitor C22, and a load capacitance CL is coupled with the output node of the booster unit 25. The main bootstrapping circuit 25a is similar in arrangement to that of the prior art dynamic random access memory device, and no further description on the circuit arrangement is incorporated hereinbelow.

The bootstrapping circuit 25a is energized by the timing control signal Pin indicative of a timing for driving one of the word lines WL1 to WLm, and produces a boosted voltage level Vboot. The boosted voltage level Vboot is supplied to the row address decoder/word line driver unit 12a, and is used for selectively energizing the word lines WL1 to WLm.

The auxiliary booster circuit 25b comprises an inverter 25c for producing a complementary signal of the first control signal CL1, an AND gate 25d having input nodes supplied with the complementary signal and the delayed timing control signal and the auxiliary bootstrap capacitor C22. The inverter 25c and the AND gate 25d allow the auxiliary bootstrap capacitor C22 to participate the bootstrapping phenomenon together with the main bootstrap capacitor C21 and the load capacitance CL when the external power voltage level Vext exceeds the voltage level Vx.

While the control signal CL1 from the first voltage detector 15a is in the low voltage level equivalent to logic "0" level, the AND gate the boosted voltage level Vboot is given by Equation 9.

$$Vboot = \{1 + (C21 + C22)/(C21 + C22 + CL)\}Vint \qquad \text{Equation 9}$$
$$= a1 \, Vint$$

On the other hand, while the control signal CL1 is in the high voltage level equivalent to logic "1" level, the boosted voltage level Vboot is given by Equation 10.

$$Vboot = [1 + \{C21/(C21 + C22 + CL)\}]Vint \qquad \text{Equation 10}$$
$$= a2 \, Vint$$

The capacitors C21 and C22 are selected in such a manner that a1 and a2 are adjusted to (5 volts/2.3 volts) =1.74 and (6 volts/4.14 volts) =1.45, respectively.

Although particular embodiments of the present invention have been shown and described, it will be obvious to those skilled in the art that various changes and modifications may be made without departing from the spirit and scope of the present invention. For example, the various voltage ranges R11 and R12 are available for the standard modes and the burn-in testing process, and the voltage profile of the enable signal EN is not limited to the plots in FIG. 21.

What is claimed is:

1. A dynamic random access memory device selectively entering standard modes for selectively accessing data bits and a testing mode for a burn-in testing process, comprising:

a) a plurality of addressable memory cells arranged in rows and columns, and respectively storing said data bits, each of said plurality of addressable memory cells being implemented by a switching transistor and a storage capacitor connected in series;

b) a plurality of word lines respectively associated with the rows of addressable memory cells, and connected with gate electrodes of the switching transistors in the associated rows;

c) a plurality of bit line pairs respectively associated with the columns of addressable memory cells, and having bit lines selectively connected with the drain nodes of said switching transistors in the associated columns;

d) a row address decoder and word line driver unit connected with said plurality of word lines, and lifting one of said plurality of word lines to a boosted voltage level for conducting accumulating electrodes of the storage capacitors through the switching transistors with the bit lines of said plurality of bit line pairs;

e) a plurality of sense amplifier circuits respectively connected with said plurality of bit line pairs, and operative to increase potential differences indicative of data bits in magnitude so that the bit lines of said plurality of bit line pairs selectively go to a step-down power voltage level and a low voltage level;

f) an intermediate voltage generating unit producing an intermediate voltage level from said step-down power voltage, and supplied to counter electrodes of said storage capacitors; and g) a power supplying system supplied with a regular power voltage level from the outside of said dynamic random access memory device, and having g-1) a first sub-system responsive to a first control signal for producing said step-down power voltage level from said regular power voltage level, and distributing said step-down power voltage level to at least said plurality of sense amplifier circuits and said intermediate voltage generating unit, said step-down power voltage being constant while said regular power voltage ranges from a first predetermined voltage level to a second predetermined voltage level, said step-down power voltage being proportional to and lower than said regular power voltage level after said regular power voltage level exceeds said second predetermined voltage level, g-2) a first voltage detecting circuit monitoring said step-down power voltage level to see whether or not said regular power voltage level exceeds said second predetermined voltage level for producing said first control signal indicative of said regular power voltage level over said second predetermined voltage level, and g-3) a second sub-system producing said boosted voltage level for distributing said boosted voltage level to at least said row address decoder and word line driver unit, and responsive to said first control signal for regulating said boosted voltage level first predetermined times larger than said step-down power voltage while said regular power voltage is lower than said second predetermined voltage level, said second sub-system being further operative to regulate said boosted voltage level second predetermined times larger than said step-down power voltage level after said regular power voltage level exceeds said second predetermined voltage level, said first predetermined times being different from said second predetermined times, said regular power voltage level being lower than said second predetermined voltage level in said standard modes and higher than said second predetermined voltage level in said burn-in testing process.

2. A dynamic random access memory device as set forth in claim 1, in which said second sub-system comprises
- a second voltage detecting circuit monitoring said boosted voltage level to see whether or not said boosted voltage level becomes lower than a first target voltage level, and producing a second control signal while said boosted voltage level is lower than said first target voltage level,
- a third voltage detecting circuit monitoring said boosted voltage level to see whether or not said boosted voltage level becomes lower than a second target voltage level different from said first target voltage level, and producing a third control signal while said boosted voltage level is lower than said second target voltage level,
- a switching circuit responsive to said first control signal for selectively transferring said second and third control signals as an enable signal,
- an oscillator responsive to said enable signal for producing a driving pulse signal, and
- a booster circuit energized by said driving pulse signal for increasing said boosted voltage level in magnitude.

3. A dynamic random access memory device as set forth in claim 2, in which said booster circuit is implemented by a charge pump.

4. A dynamic random access memory device as set forth in claim 2, in which one of said second and third voltage detecting circuits comprises
- a reference signal generator connected between a source of said boosted voltage level and a constant voltage source for producing a reference signal indicative of the value of said boosted voltage level,
- a current mirror circuit having two input nodes supplied with said reference voltage signal and said step-down power voltage level, and comparing said reference voltage signal with said step-down power voltage level for producing an output signal indicative of consistence between said reference voltage signal and said step-down power voltage level, said reference voltage generator being arranged in such a manner that said second or third control signal becomes consistent with said step-down power voltage when said boosted voltage level becomes lower than said first or second target voltage level, and
- a driving circuit responsive to said output signal of said current mirror circuit for producing either second or third control signal.

5. A dynamic random access memory device as set forth in claim 4, in which said reference signal generator is implemented by a series of resistors connected between said source of said boosted voltage level and said constant voltage source for producing said reference signal at an intermediate node between said resistors, the resistances of said resistors being arranged in such a manner that said second or third control signal becomes consistent with said step-down power voltage when said boosted voltage level becomes lower than said first or second target voltage level.

6. A dynamic random access memory device as set forth in claim 1, in which said second sub-system comprises
- a bootstrapping circuit having a main bootstrap capacitor responsive to a timing signal for lifting said one of said plurality of word lines for producing said boosted voltage level, and
- an auxiliary booster circuit having an auxiliary bootstrap capacitor, and responsive to said first control signal for allowing said auxiliary bootstrap capacitor to participate the bootstrapping phenomenon together with said main bootstrap capacitor and a load capacitance electrically coupled with an output node of said bootstrapping circuit.

* * * * *

UNITED STATES PATENT AND TRADEMARK OFFICE
CERTIFICATE OF CORRECTION

PATENT NO. : 5,363,333
DATED : November 8, 1994
INVENTOR(S) : Akira TSUJIMOTO

It is certified that error appears in the above-indentified patent and that said Letters Patent is hereby corrected as shown below:

Col. 5, line 31 delete "C6)} vint" insert -- C1)} Vint --

Col. 8, line 52 delete "!"

Signed and Sealed this

Sixth Day of June, 1995

Attest:

BRUCE LEHMAN

Attesting Officer     Commissioner of Patents and Trademarks